United States Patent [19]
Rhee et al.

[11] Patent Number: 6,147,561
[45] Date of Patent: Nov. 14, 2000

[54] PHASE/FREQUENCY DETECTOR WITH TIME-DELAYED INPUTS IN A CHARGE PUMP BASED PHASE LOCKED LOOP AND A METHOD FOR ENHANCING THE PHASE LOCKED LOOP GAIN

[75] Inventors: Woogeun Rhee, Irvine; Akbar Ali, Garden Grove, both of Calif.

[73] Assignee: Conexant Systems, Inc., Newport Beach, Calif.

[21] Appl. No.: 09/363,779

[22] Filed: Jul. 29, 1999

[51] Int. Cl.$^7$ .................................................. H03L 7/00
[52] U.S. Cl. ................................................ 331/12; 331/17
[58] Field of Search ................................. 331/11, 12, 17, 331/25, 27; 327/149, 150, 152, 153, 158, 161

[56] References Cited

U.S. PATENT DOCUMENTS

| | | | |
|---|---|---|---|
| 5,521,948 | 5/1996 | Takeuchi | 375/376 |
| 5,550,515 | 8/1996 | Liang et al. | 331/11 |
| 5,614,869 | 3/1997 | Bland | 331/1 A |
| 6,060,953 | 5/2000 | Tsai | 331/11 |

OTHER PUBLICATIONS

National Semiconductor, LMX2330A/LMX2331A/LMX2332A PLLatinum Dual Frequency Synthesizer for RF Personal Communications, May 1999, pp. 1–16.

*Primary Examiner*—Robert Pascal
*Assistant Examiner*—Henry Choe
*Attorney, Agent, or Firm*—Foley & Lardner

[57] ABSTRACT

A phase locked loop (PLL) circuit with time-delayed phase/frequency detector (PFD) input signals and a method for generating high PFD gain in such a circuit is provided. One circuit embodiment includes a first divider, a phase/frequency detector having a plurality of input pairs, a plurality of input signal reference delay elements connected in a series between the first divider and the PFD, a charge pump, a loop filter, a voltage-controlled oscillator (VCO), a second divider, and a plurality of feedback signal delay elements connected in a series. The corresponding method embodiment includes steps for receiving digital input signals with reference frequency and period T in the first divider, dividing the reference frequency by a value R, providing a plurality of time-delayed PFD reference input signals in each period T, dividing the VCO frequency by a value M in the second divider, and providing a plurality of time-delayed PFD feedback input signals in each period T. The delayed reference signal and the delayed feedback signal at each PFD input pair have the same time delay. Another embodiment circuit has a first divider, a plurality of phase/frequency detectors (PFDs), a charge pump, two OR gates, a loop filter, a voltage-controlled oscillator (VCO), and a second divider. The corresponding method embodiment includes the steps for receiving reference frequency signals in the first divider, dividing the reference frequency by a value R, and creating a plurality of time-delayed reference output signals in each period T for PFD reference inputs, or-ing the output signals from the plurality of the PDFs to supply the charge pump, dividing the VCO frequency by a value M in the second divider, creating a plurality of time-delayed feedback output signals in each period T, and supplying each PFD feedback input with one of the plurality of time-delayed feedback output signals.

30 Claims, 3 Drawing Sheets

PHASE/FREQUENCY DETECTOR WITH TIME-DELAYED INPUTS IN A CHARGE PUMP BASED PHASE LOCKED LOOP AND A METHOD FOR ENHANCING THE PHASE LOCKED LOOP GAIN

BACKGROUND OF THE INVENTION

1. Field of the Invention

The present invention relates generally to the field of communication devices and more particularly to an improved charge pump-based phase locked loop circuit, usable in a frequency synthesizer.

2. Related Art

Digital communication devices employ frequency synthesizers for controlling transmission and reception frequency for radio communication. Phase locked loops (PLLs) are routinely used for data communications, frequency synthesis, clock generation, clock recovery, and similar applications. PLLs are often implemented in integrated circuits and commonly are realized with charge pump techniques.

FIG. 1 illustrates a block diagram of a conventional charge pump-based phase locked loop circuit. The phase locked loop circuit includes a phase/frequency detector 14, a charge pump 18, a loop filter 20, a voltage-controlled oscillator (VCO) 22, a reference divider 12 and an M divider 24. The basic digital PLL circuit of FIG. 1 receives an input signal 10, in form of binary signals (square waves) with reference frequency $f_{ref}$, from a reference frequency source, not shown. The reference frequency source is a crystal oscillator which generates a well-controlled reference signal at a known high frequency. The reference divider 12 divides the input signal 10 reference frequency $f_{ref}$ by an integer R, to allow use of a higher frequency reference frequency source. In response to this reference signal, the local oscillator VCO 22 generates an output signal 16.

The output signal of the reference divider 12 is an input signal 13 of the phase/frequency detector 14. The PLL circuit output signal 16 with frequency $f_{out}$ is also input into the phase/frequency detector 14, into its feedback input, after modification in the M divider 24. The phase/frequency detector 14 outputs a signal 19 having a voltage proportional to a phase difference between the frequencies of the two signals input into the phase/frequency detector 14. The output of the phase/frequency detector 14 is coupled to the charge pump 18, the output current $I_c$ 21 of which is then input into the loop filter 20.

The charge pump 18 is an analog element which acts in response to an indication of a phase difference between signals supplied by the reference frequency source oscillator and signals supplied by the voltage controlled oscillator 22. The charge pump 18 generates phase error correction pulses which are supplied to the loop filter 20 and the voltage controlled oscillator 22 to change the frequency of the VCO output signal 16. Conventional charge pump circuits typically contain a current source and a current sink to pull the charge pump 18 output voltage up or down, respectively, by providing appropriate current to a capacitive input of the loop filter 20.

The loop filter 20 smoothes the phase/frequency detector 14 output voltage and determines the loop performance, based upon selected loop filter 20 elements. The output of the loop filter 20 adjusts the voltage of the voltage-controlled oscillator (VCO) 22 and determines the frequency $f_{out}$ of the output signal 16 of the VCO 22 and the PLL circuit. The output signal 16 of the VCO 22 is then fed back, divided by integer M in the M divider 24, and input into the feedback input of the phase/frequency detector 14. The output voltage of the phase/frequency detector 14 varies according to any change in the phase difference between the output signal 16 of the VCO 22 and the input signal 10.

The PLL circuit produces the output signal 16 whose frequency $f_{out}$ is equal to the value $[(f_{ref}/R)/N]$, and the phase of the VCO output signal 16 follows the phase of the input reference signal 10. Therefore, the feedback of the PLL provides a means for locking the phase and frequency $f_{out}$ of the output signal 16 in accordance with the phase and frequency of the input reference signal 10. If the input reference signal 10 has a highly stable reference frequency, the PLL circuit produces the output signal 16 with a highly stable frequency $f_{out}$.

Conventional frequency synthesizers with PLL loops typically obtain frequency division with large division values when they are used to generate RF frequencies from a high-frequency reference source. In a PLL circuit, the PLL gain is determined by multiplying the PFD gain with the VCO gain. In the circuit of FIG. 1, since the VCO 22 gain is usually fixed by the system, only the loop filter 20 elements and the phase/frequency detector 14 gain can provide the PLL designer with the freedom to optimize the PLL behavior and obtain a circuit with high PLL gain. The PFD gain is a function of the charge pump 18 output current $I_c$ 21 and a resistor of the loop filter 20. Therefore, the phase/frequency detector 14 gain is set by the output current $I_c$ 21 of the charge pump 18, when the loop filter 20 resistor value cannot be changed, which limits the designer's flexibility regarding the number of PLL parameters that can be controlled. So, in a conventional PLL circuit, to increase the PFD gain and thus the PLL gain, the magnitude of the current $I_c$ 21 must be increased to meet the requirements.

In the conventional frequency synthesizer-based applications the magnitude of the current input into the charge pump 18 has to be high to meet the requirement for the loop filter 20 and the VCO 22 gain. With this constraint, it can be difficult to design a compact charge pump with low-power and fast switching time. For example, model LMX2330A integer-N frequency synthesizer, manufactured by National Semiconductors, requires a current of 4.5 mA for the charge pump, used in their frequency synthesizer circuit, which makes the charge pump quite large.

Accordingly, there is a need in the art for an improved charge pump-based phase locked loop circuit with high gain, using a low-power small charge pump with fast switching time. There is also a need for a method for enhancing the gain of an improved charge pump-based phase locked loop circuit, while reducing the magnitude of the current input into the charge pump to provide a charge pump circuit with fast operating speed.

SUMMARY OF THE DISCLOSURE

Phase locked loop (PLL) circuit configurations with time-delayed phase/frequency detector (PFD) input signals according to several embodiments of the present invention are described herein with corresponding method embodiments for generating high PFD gains.

A first circuit embodiment of the present invention includes a first divider, a phase/frequency detector having a plurality of input pairs, a plurality of input signal reference delay elements connected in a series between the first divider and the PFD, a charge pump, a loop filter, a voltage-controlled oscillator (VCO), a second divider, and a plurality of feedback signal delay elements connected in a series. A first reference delay element is connected to the first divider output and the reference input of a first PFD input pair, and the other reference delay elements are connected to a previous reference delay element in the series, and the reference input of the corresponding PFD input pair. A first delay element is connected to the second divider output and the feedback input of the corresponding PFD input pair, and the last feedback delay element is connected to a previous delay element in the series, and the feedback input of the corresponding PFD input pair.

A method embodiment corresponding to the first apparatus embodiment includes steps for receiving digital input signals with reference frequency and period T in the first divider, dividing the reference frequency by a value R, providing a plurality of time-delayed PFD reference input signals in each period T, dividing the VCO frequency by a value M in the second divider, and providing a plurality of time-delayed PFD feedback input signals in each period T. The delayed reference signal and the delayed feedback signal at each PFD input pair have the same time delay.

A second apparatus embodiment includes a first divider, a plurality of phase/frequency detectors (PFDs), a charge pump, two OR gates, a loop filter, a voltage-controlled oscillator (VCO), and a second divider.

In some aspects of this embodiment the first divider and the second divider each have a control logic circuit for adjusting the number of delay elements N-1, for obtaining the PFD gain accordingly.

A method embodiment corresponding to the second apparatus embodiment includes the steps for receiving reference frequency signals in the first divider, dividing the reference frequency by a value R, and creating a plurality of time-delayed reference output signals in each period T for PFD reference inputs, or the output signals from the plurality of the PDFs to supply the charge pump, dividing the VCO frequency by a value M in the second divider, creating a plurality of time-delayed feedback output signals in each period T, and supplying each PFD feedback input with one of the plurality of time-delayed feedback output signals.

In the above-referenced embodiments of the present invention R, M and N are integers, and N represents the number of time delayed PFD signal pairs in each period T, used for increasing the PFD phase detection gain N times by multiplying the frequency of the charge pump input signal. The time delay period is preferably between four and sixteen times smaller than the period T. The width of each delayed reference and feedback signal should be no more than 1/N times the period T.

In further embodiments of the present invention the width of each delayed reference and feedback signal is less than the width of the reference frequency input signals having the period T.

BRIEF DESCRIPTION OF THE DRAWINGS

Referring now to the drawings, in which like reference numbers represent corresponding parts throughout.

Figure 7:
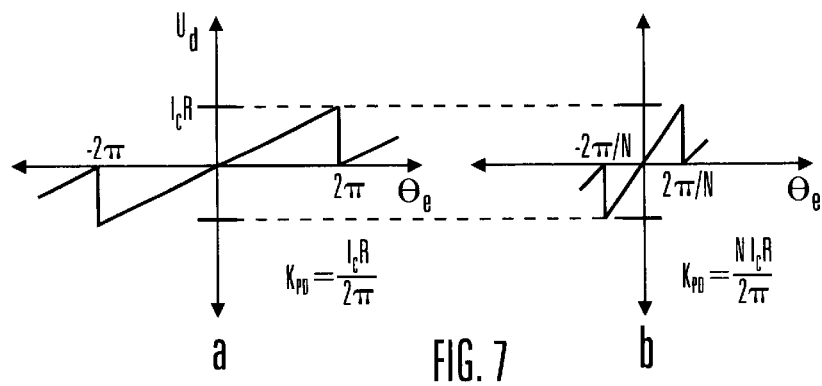
Figure 8:
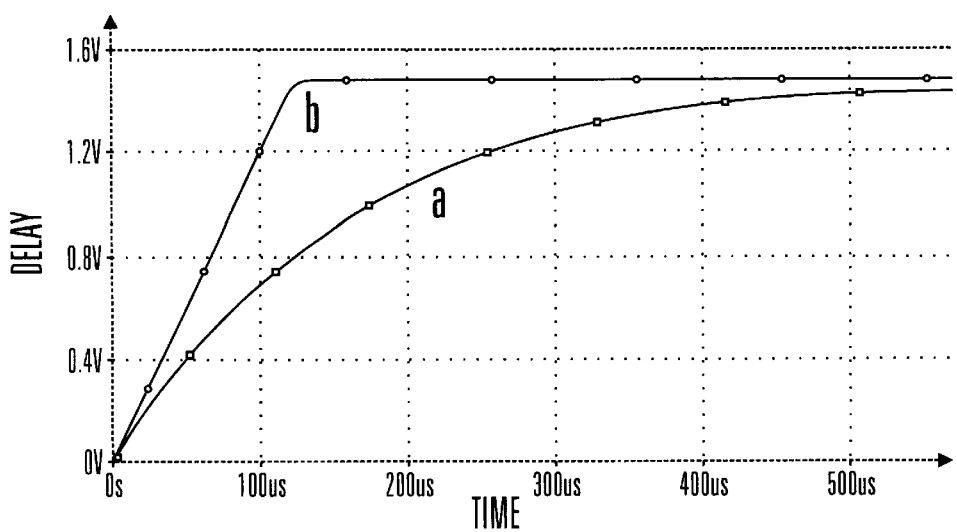
Figure 9:
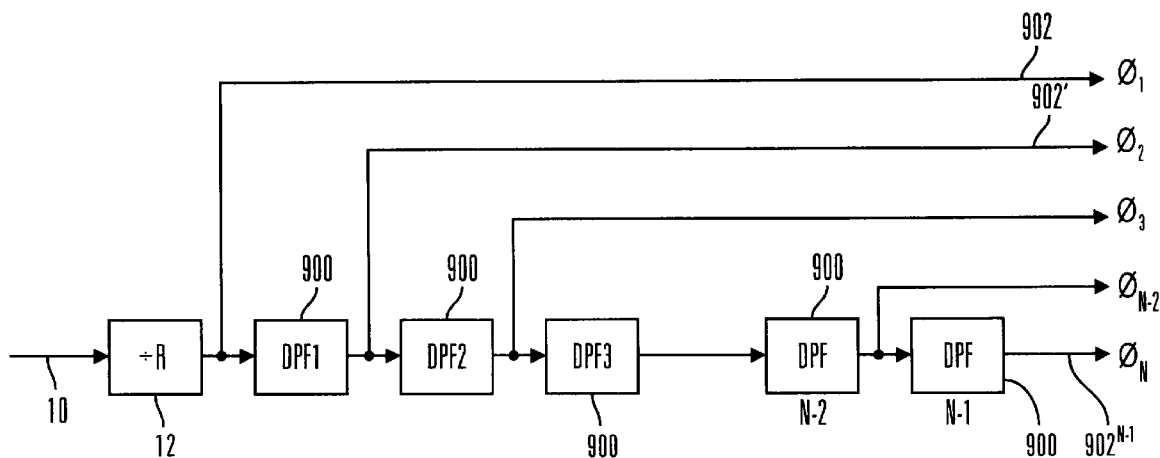
Figure 10:
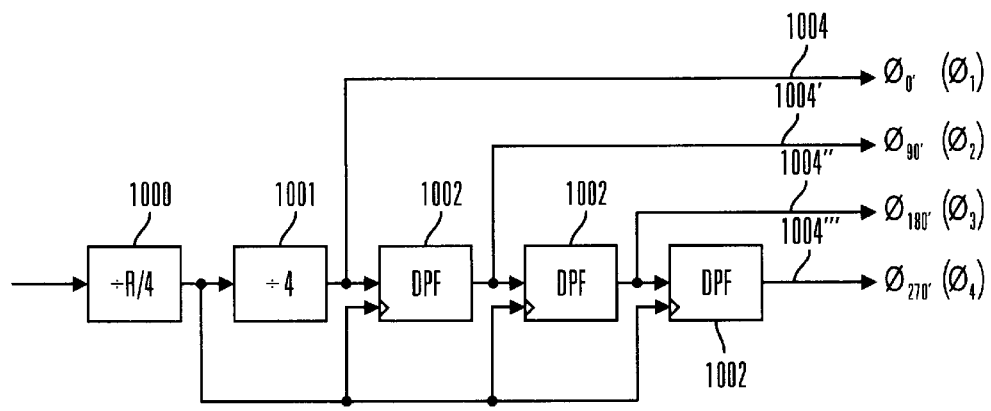
Figure 11:
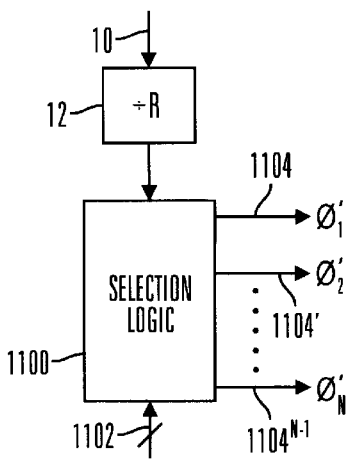

The FIG. 7(a) illustrates a voltage of the output signal of the loop filter 20 as a function of a phase error $\theta$, in a conventional PLL circuit;

The FIG. 7(b) illustrates a voltage of the output signal of the loop filter 20 as a function of a phase error $\theta$, according to preferred embodiments of the present invention;

FIG. 8(a) is a diagram showing results obtained by simulation of a conventional device;

FIG. 8(b) is a diagram showing results obtained by simulation of a method and devices according to embodiments of the present invention;

FIG. 9 illustrates a general type of R, M dividers using a conventional R, M divider and a cascade of delay elements, according to preferred embodiments of the present invention;

FIG. 10 illustrates a type of R, M dividers where N=4 and values of integers R, M are multiples of four, according to a preferred embodiment of the present invention; and FIG. 11 illustrates a type of R, M dividers with a control logic circuit, according to a preferred embodiment of the present invention.

DETAILED DESCRIPTION OF PREFERRED EMBODIMENTS

In the following description, reference is made to the accompanying drawings which form a part hereof, and in which are shown, by way of illustration, several embodiments of the present invention. It is understood that other embodiments may be utilized and structural changes may be made without departing from the scope of the present invention.

The present invention relates generally to an improved charge pump-based phase locked loop circuit, usable in a frequency synthesizer. Specifically, preferred embodiments of the present invention include a PLL with one or more improved phase/frequency detectors provided with a series of time-delayed PFD input signals sharing the same period T as the conventional input signal, in order to obtain enhanced PLL gain, and a method for enhancing the PLL and PFD gain of the PLL with the improved phase/frequency detector(s), by substituting each conventional PFD input signal with a series of time-delayed input signals, sharing the same period T as the conventional input signal.

Figure 2:
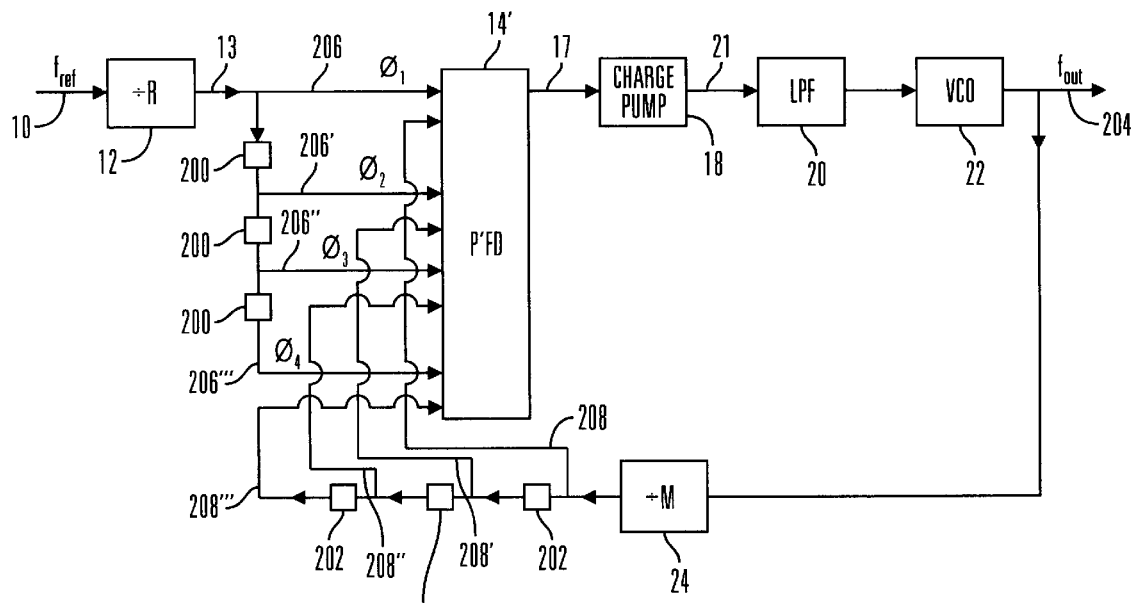
FIG. 2 is a block diagram of an improved charge pump-based phase locked loop circuit utilizing only one PFD with several inputs, according to a preferred embodiment of the present invention.
Figure 5:
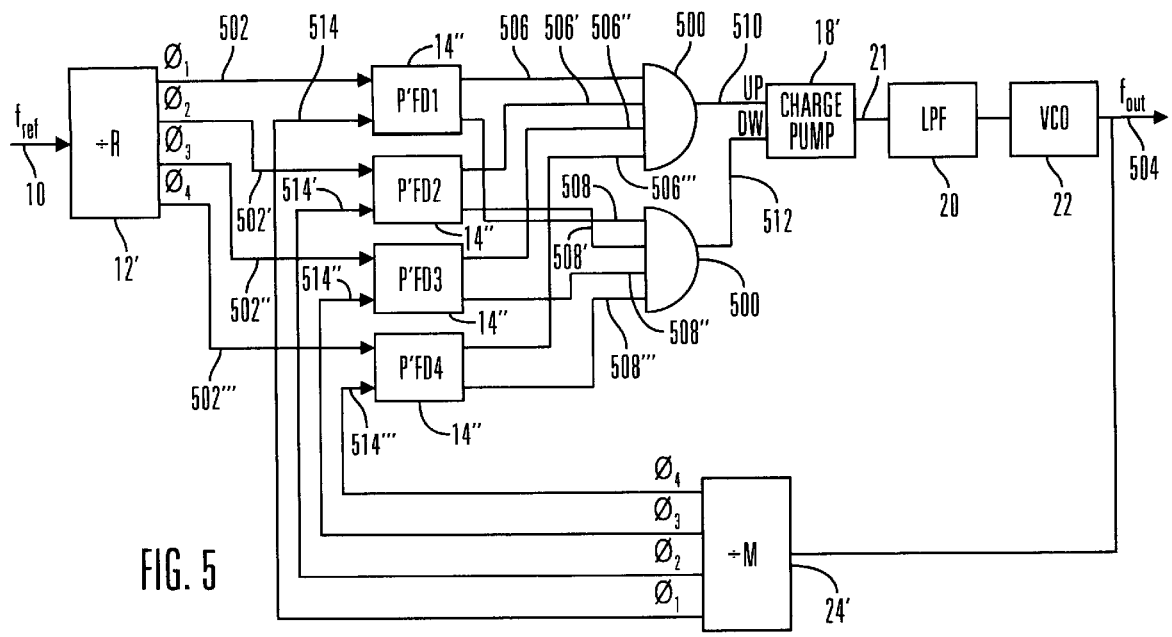
FIG. 5 is a block diagram of an improved charge pump-based phase locked loop circuit utilizing several PFDs, according to another preferred embodiment of the present invention.

Preferred embodiments of the present invention are described herein primarily with reference to FIGS. 2 and 5. However, it will be understood that further embodiments are possible with other types of improved phase/frequency detectors, provided that they receive a series of time-delayed PFD input signals, sharing the same period T as the conventional input signal, in order to obtain a PLL with enhanced gain.

Figure 1:
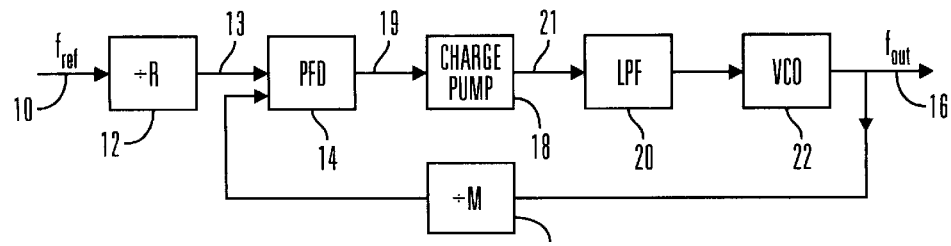
FIG. 1 is a block diagram of a conventional charge pump-based phase locked loop circuit.

The PLL circuits of preferred embodiments of the present invention effectively operate generally as the conventional device shown in FIG. 1, and described above. Details of the circuit elements presented in FIGS. 2 and 5, are well known in the art and are not described herein for purposes of simplifying the present disclosure. The elements of FIGS. 2 and 5 which function substantially the same as the elements in FIG. 1 are given the same name and reference number. Although there may be any number of delay elements in the embodiments of FIGS. 2 and 5, for purposes of clarity these two embodiments are each represented, with three delay elements.

According to one preferred embodiment, a block diagram of an improved charge pump-based phase locked loop circuit, utilizing only one PFD with several inputs, is represented in FIG. 2. In this embodiment, the phase locked loop circuit has a reference signal 10 input into the reference divider 12, modified to have several inputs. The illustrated embodiment utilizes a conventional reference divider 12. The output signal 13 from the reference divider 12 is entered in a cascade of delay elements 200. Each delay element 200 is preferably comprised of a plurality of logic gates used to shift the phase of the signal 13.

The time delay in each delay element 200 of the cascade is the time interval required for the input signal 13 to propagate through the logic elements of the delay element 200. Each delay is preferably a multiple of a predetermined time interval Δ, determined by the reference divider's 12 internal clock. Each delay $d_i$ is calculated with an expression $d_i=i*\Delta$, where i=0, . . . , N−1. In a PLL circuit with three delay elements as shown in FIG. 2, there are four input delay signals having relative phase delays of 0, 90, 180 and 270 degrees. Therefore, in preferred embodiments of the present invention, instead of a conventional PFD input signal 13, a series of N time delayed input signals in each period T, are provided for increasing the PFD phase detection gain N times by multiplying the frequency of the charge pump input signal.

Each time-delayed output signal 206, 206', 206'', 206''' from a delay element 200 enters a reference input of the phase/frequency detector 14'. The phase/frequency detector 14' is the phase/frequency detector 14 of FIG. 1, but configured to accept several pairs of reference and feedback inputs, each pair from another delay element 200. The phase/frequency detector 14' may include two D-flip/flops.

Circuits using high current, such as frequency synthesizers, are often supported by suitable charge pumps, such as the charge pump 18. The phase/frequency detector 14' provides only one output signal 17 which enters the charge pump 18. The charge pump 18 output current $I_c$ 21 determines the phase/frequency detector 14' gain. The charge pump circuit 18 has an input coupled to the phase/frequency detector 14' output for receiving the phase adjustment signal 17, and the charge pump output for providing the current $I_c$ 21 which enters the loop filter 20. The loop filter 20 may have any suitable structure, preferably including a capacitive input. The design of such a loop filter is well within the capability of those ordinarily skilled in the art.

The loop filter 20 output signal adjusts the voltage of the voltage-controlled oscillator (VCO) 22 and determines the frequency of the output signal 204 of the VCO 22 and the PLL circuit. The output signal 204 of the VCO 22 is then fed back to the phase/frequency detector 14', through the M divider 24 and several delay elements 202. Each output signal 208, 208', 208'', 208''' from the delay elements 202 is input into a respectively associated feedback input of the phase/frequency detector 14', so that each input pair of the phase/frequency detector 14' has one signal delayed by the delay element 200 and one signal delayed by the delay element 202, wherein both delay elements 200, 202 have the same time delay period. The delay elements 202 are also preferably comprised of a plurality of logic gates.

FIG. 5 is a block diagram of an improved charge pump-based phase locked loop circuit utilizing several PFDs in the reference and feedback loops. In this embodiment the reference divider 12' has an embedded clock, not shown, and a cascade of delay elements, as shown in FIGS. 9, 10, 11. The reference divider 12' has several outputs and, for each output, a delay element is inside the reference divider 12' to provide a series of time-delayed output signals 502, 502', 502'', 502''', each with a different time delay. Each delayed output signal 502, 502', 502'', 502''' is provided to a respective reference input of one of several phase/frequency detectors 14''. Each phase/frequency detector 14'' has two output signals, an up output signal 506, 506', 506'' or 506''' and a down output signal 508, 508', 508'' or 508'''.

The up output signals 506, 506', 506'', 506''' from all phase/frequency detectors 14'' are or-ed in an OR gate 500 to enter an up input 510 of the charge pump 18', which is configured with two different inputs. The down output signals 508, 508', 508'', 508''' from all phase/frequency detectors 14'' are or in another OR gate 500 to enter a down input 512 of the charge pump 18'. The VCO 22 and PLL circuit output signal 504 is then fed back to the phase/frequency detectors 14'', through the M divider 24'. The M divider 24' uses an embedded clock, not shown, to provide a series of time delayed output signals 514, 514', 514'', 514''', each with a different time delay, which correspond to the signals 502, 502', 25 502'', 502''' delayed inside the reference divider 12'. Each phase/frequency detector 14'' input pair has one signal delayed inside the reference divider 12' and one signal delayed inside the M divider 24', both delayed by the same time delay period.

Therefore, in the above referenced exemplary embodiments, for each period T of the conventional input signal 13 of FIG. 1, instead of just one input signal, there is a series of time-delayed signals input into the phase/frequency detector 14', 14'' of FIGS. 2, 5, respectively. The time delay between any two delay elements is defined in relation to the period T of the input signal 13. The time delay period is preferably in the order of four to sixteen times smaller than the input signal 13 period T, depending on the implementation. In preferred embodiments of the present invention, the delayed input signals are not overlaid in order to give the PFD 14', 14'' and charge pump 18, 18' sufficient time to perform within the time period T. Therefore, in preferred embodiments of the present invention, the width w of each delayed input signal does not exceed 1/N times the period T of the input signal 10.

The R divider 12' and M divider 24' of FIG. 5 may be conventional R, M dividers 12, 24, which may include a chain of flip-flops and a comparator logic. FIG. 9 illustrates a general type of an R, M divider 12', 24', which uses a conventional R, M divider 12, 24 and a cascade of delay elements 900, providing multiple outputs 902, 902', . . . , $902^{N-1}$.

In a conventional divider, a clock is used to create time reference, which is used to divide the frequency of the reference signal to the value required for the PLL PFD. The same clock can be used in embodiments of the present invention to provide a series of output signals, each with different phase, each representing the delayed input signal. Moreover, instead of using the delay elements within the R, M dividers 12, 24, in an alternate embodiment of the present invention an independent counter could be used to provide the series of time-delayed output signals. The delay elements may include D flip-flops, NAND gates or inverters, configured to delay receipt of the signals at the charge pump 18, 18'. Digital delay lines are preferred to analog delay lines because they contribute significantly less to the phase noise of the loop. The introduction of a delay line both in feedback path and in the reference path of the loop does not effect the behavior of the loop itself, because it represents a fixed phase offset in the loop. This is made possible because all of the signals in the PLL are synchronous.

The counter or the R, M dividers may be implemented as programmable counters, having a control logic circuit used to change the integer values R and M, in order to change $f_{out}$ to a desired value. FIG. 11 illustrates an embodiment of the present invention with R, M dividers having a control logic circuit 1100. The control logic circuit 1100 is used to program the number N of outputs 1104, 1104'', . . . , 1104$^{N-1}$, provided at the exit, and thus the number of delay elements N–1. Control signal 1102 depends on the number of delay elements and the characteristics of the R, M dividers.

FIG. 10 illustrates a special type of the R, M divider 12', 24', where N=4 and the integers R, M are multiples of four, applicable to the PLL of FIG. 5. In this embodiment the R, M divider 1000 has its R, M values divided by four to obtain a signal with frequency four times higher than in a conventional circuit, to be used as a clock signal for the delay elements 1002, having D flip-flops. Next, the frequency is divided by four in a divider 1001 to provide frequency for the output signals 1004, 1004', 1004'', 1004''', which are provided at the PFD 14'' input. In this example, the crystal oscillator output provides a reference signal with $f_{ref}$=4 MHz. In order to get the PFD input signals of 250 kHz with a period of 4 $\mu$sec, the integer R=16 is used. The R/4 divider 1000 provides a signal with frequency reduced by $^{16}/_4$=4 times, to provide signals with f=1 MHz and delay period of 1 $\mu$sec at the clock input of each D flip-flop delay element 1002. Next, frequency is reduced four times in the divider 1001 to get the PFD 14'' input signals with f=250 kHz and period of 4 $\mu$sec.

Figure 3:
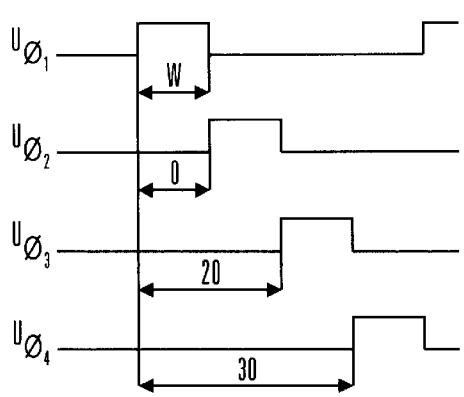
FIG. 3 is a timing diagram showing voltage waveforms of several delayed input signals entering the PFD, according to preferred embodiments of the present invention.

FIG. 3 is a timing diagram showing voltage waveforms of signals corresponding to FIGS. 2, 5, with four delayed input signal pairs 206, 208, 206', 208', 206'', 208'', 206''', 208''' or 502, 514, 502', 514', 502'', 514'', 502''', 514''', entering the phase/frequency detector 14' or 14'', respectively, while in operation, according to the preferred embodiments of the present invention.

Figure 4:
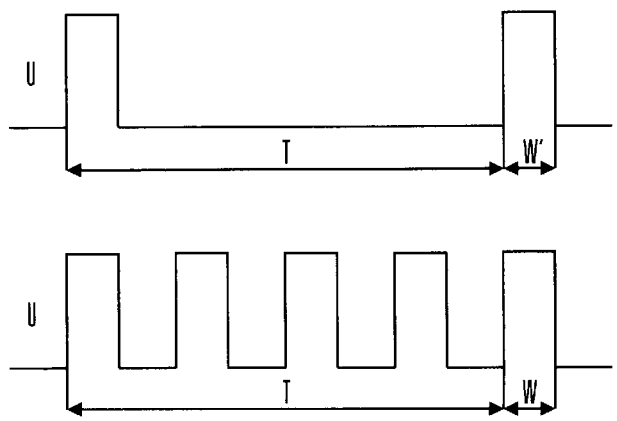
FIG. 4 is a timing diagram showing on one trace a conventional input signal to the phase/frequency detector and on another trace a series of time-delayed input signals which substitute the conventional input signal entering the PFD, according to preferred embodiments of the present invention.

FIG. 4 is a timing diagram showing on one trace a voltage of the input signal 13 to the conventional phase/frequency detector 14 and on another trace a sum of time-delayed input signals 206, 206', 206'', 206''', or 208, 208', 208'', 208''' or 502, 502', 502'', 502''' or 514, 514', 514'', 514''', entering into the phase/frequency detector 14', 14'', which substitute the conventional input signal 13 in each period T.

As can be seen in FIG. 3, the first delayed input signal 206', 208', 502', 514' is preferably delayed by a delay period $d_1$=Δ. The second delayed input signal 206'', 208'', 502'', 514'' is preferably delayed by two delay periods, i.e., $d_2$=2Δ. The third delayed input signal 206''', 208''', 502''', 514''' is preferably delayed by three delay periods, i.e., $d_3$=3Δ. In this embodiment the width w of each delayed input signal 206, 208, 206', 208', 206'', 208'', 206''', 208''' or 502, 514, 502', 514', 502'', 514'', 502''', 514''' is chosen to be the same as the width w' of the conventional input signal 13. However, in another embodiment, the width w of each delayed input signal 206, 208 or 502, 514 can be defined to be less than the width w' of the conventional input signal 13 with the same period T, and may be any suitable width w sufficient to obtain suitable output signal 204 or 504, but no more than 1/N times the period T.

Therefore, in preferred embodiments of the present invention, each delayed signal 206, 208, 206', 208', 206'', 208'', 206''', 208''' or 502, 514, 502', 514', 502'', 514'', 502''', 514''', by virtue of the time delay, has a different phase, shown with symbols $\phi_1, \ldots, \phi_4$ in FIGS. 2, 5. Creation of multiple signals in each period T, instead of just one, has the effect of time sharing the period T of the input signal 13. When the integer N equals 4, the input signal 13 frequency is quadrupled. Thus the phase/frequency detector 14', 14'' gain and the loop gain of the PLL circuit is increased, assuming that all other values are kept constant. Thus, a smaller charge pump 18, 18' can be used when the same PLL gain is desired, because the same charge pump output current can be obtained with four times smaller magnitude of the signal input into the phase/frequency detector 14', 14''.

The PLL gain=$k_d k_o$, where $k_o$ is the VCO gain, and $k_d$ is the PFD gain. The PFD gain is a function of the charge pump 18, 18', output current $I_c$ 21 and the resistor R of the loop filter 20. So, in conventional circuits, to increase the PFD gain and thus the PLL gain, the current $I_c$ 21 magnitude must be increased to meet the VCO gain. Many frequency synthesizers require relatively high charge pump currents, in the order of 4–4.5 mA. In some applications of use, it can be difficult to provide such high currents. In preferred embodiments of the present invention with N=4, instead of having one input signal to the charge pump, four time-delayed input signals of lower current magnitude, preferably 1.0–1.2 mA are supplied. Thus, the frequency of the signals entering the charge pump 18, 18' is quadrupled, instead of providing the current signals with high magnitude, to keep the PFD gain the same.

Figure 6:
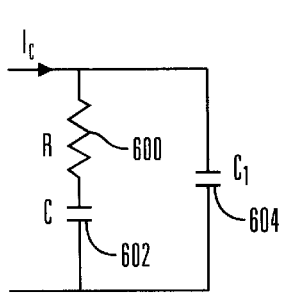
FIG. 6 is a schematic diagram showing a loop filter, according to preferred embodiments of the present invention.

The phase detection gain $K_{PD}$ in the conventional circuit of FIG. 1 is calculated by the formula $K_{PD}=I_c R/2\pi$. Calculated conventionally, $K_{PD}$ only depends on the peak current of a charge pump $I_c$ 21, which is the charge pump 18, 18' output current, and resistor R 600, which is the resistor in the RC loop filter 20 circuit connected at the output of the charge pump 18, 18', as shown in FIG. 6 representing a schematic diagram of the loop filter 20 circuit. The loop filter 20 preferably has the resistor R 600, a capacitor C 602 and an additional capacitor C1 604. However, in the circuit of FIGS. 2 and 5, the phase detection gain $K_{PD}$ of the phase/frequency detector 14', 14'' is calculated by the formula $K_{PD}=NI_c R/2\pi$. Here, the phase detection gain $K_{PD}$ also depends on the number N, where N is an integer, representing the number of time delayed signal pairs 206, 208 206', 208', 206'', 208'', 206''', 208''' or 502, 514, 502', 514', 502'', 514'', 502''', 514'''. Thus, in preferred embodiments of the present invention, the phase detector gain $K_{PD}$ is increased by the factor N. This also increases the lock-in range of the PLL circuit.

The effect of this change in the phase detection gain $K_{PD}$ is illustrated in FIGS. 7(a) and 7(b). FIGS. 7(a) and 7(b) illustrate a voltage at the output of the loop filter 20 as a function of phase error θ. FIG. 7(a) represents the function in the conventional PLL of FIG. 1, where phase error θ has a range of $-2\pi$ to $+2\pi$. The function has a sawtooth characteristic and its slope is the phase detector gain $K_{PD}=u_d/2\pi$, where $u_d=I_c*R$. FIG. 7(b) represents the function in a PLL of a preferred embodiment of the present invention, where phase error θ has a range of $-2\pi/N$ to $+2\pi/N$, and thus the lock-in range is decreased to $2\pi/N$. As shown in FIG. 7(b), the use of a series of delayed signals 206, 208, 206', 208', 206″, 208″, 206‴, 208‴ or 502, 514, 502′, 514′, 502″, 514″, 502‴, 514‴ produces a function with a higher slope, and thus higher phase detection gain $K_{PD}$. It can be seen that $K_{PD}$ increases with N, where N is the number of time delayed signal pairs 206, 208 206′, 208′, 206″, 208″, 206‴, 208‴ or 502, 514, 502′, 514′, 502″, 514″, 502‴, 514‴, without increasing the charge pump 18, 18′ current $I_c$. Therefore, in addition to the available PLL circuit parameters such as the loop filter 20 elements, the VCO 22 gain and the charge pump 18, 18′ current $I_c$, the circuit designer can also use the parameters such as the time delay duration and number N of delay signals to reduce the design requirements of the charge pump 18, 18′, such as $I_c$ and size, or to further optimize the PLL circuit performance.

One method embodiment of the present invention for enhancing the gain of the phase locked loop circuit of FIG. 2, with a phase/frequency detector having a plurality of input pairs, includes the steps of receiving digital input signals with reference frequency and period T, creating a plurality of time-delayed reference output signals from the digital input signals in each period T, receiving on each PFD reference input one of the plurality of time-delayed reference output signals, creating a plurality of time-delayed feedback output signals from the loop output signals in each period T, and supplying each PFD feedback input with one of the plurality of time-delayed feedback output signals. The time-delayed reference output signal and the time-delayed feedback output signal at each PFD input pair have the same time delay.

Another method embodiment of the present invention for enhancing the gain of the phase locked loop circuit of FIG. 5, with a plurality of phase/frequency detectors, includes the steps of receiving digital input signals with reference frequency and period T, creating a plurality of time-delayed reference output signals from the digital input signals in each period T, receiving on each PFD reference input one of the plurality of time-delayed reference output signals, or output signals from the plurality of the PDFs and supplying a charge pump, loop filter and voltage-controlled oscillator (VCO) connected in a series, creating a plurality of time-delayed feedback output signals in each period T from the VCO output signal, and supplying each PFD feedback input with one of the plurality of time-delayed feedback output signals.

In the above-described preferred embodiments of FIGS. 2, 5, each conventional input signal 13 is substituted with four delayed signals, where the delay is carried out by three delay elements. However, in further preferred embodiments, there may be N delayed input signals and N−1 delay elements, where N may be any integer, preferably as high as 16. Of course, as the number of delay elements increases, the time required to carry out the processes in the PLL may also increase, thereby possibly decreasing the gain of the loop.

With the method and the improved PLL of preferred embodiments of the present invention, when N=4, a 400% increase in gain may be achieved, relative to the gain achieved in a conventional circuit where there are no time delayed inputs. As the number N of the delay signals is increased further, the efficiency also increases further. In further embodiments, it may be more beneficial to reduce the input signals pulse width w to a pre-determined value, which may increase the gain even further. The allowed pre-determined impulse width w value is also determined by the number of delay elements.

In some applications, it may be beneficial to keep the PFD gain the same. Then, the input signal 13 should have much smaller magnitude and the four delayed input signals should also have smaller magnitudes to keep the charge pump 18, 18′ output current $I_c$ the same as in the conventional circuit, which would keep the same gain as in the conventional circuit of FIG. 1. Therefore, when there are four delayed input signals, the magnitude of the current input into the charge pump 18, 18′ now need only be 1–1.2 mA. In these applications, the pulse width w may be further shortened, because smaller width means quicker PFD turn on/off time and even better performance.

Diagrams of FIGS. 8(a) and 8(b) represent voltage as a function of time, to show results obtained by simulation of the conventional device of FIG. 1 and a method and device embodiment of the present invention in a PLL with three delay elements of FIGS. 2, 5, respectively. The FIG. 8(a) shows that the conventional device has a large, exponential lock-in range. The FIG. 8(b) shows that, in a method and device embodiment of the present invention, the lock-in range is linear and rises much faster. Since the obtained slew of the voltage function is higher, the simulation confirms that a method and device embodiment of the present invention provides the PLL with enhanced gain. Thus, preferred embodiments of the present invention improve the PFD and PLL gain, decrease the lock-in range to 2π/N, and improve the out of lock settling time, and, thus increase frequency synthesizer bandwidth. Moreover, for the same gain, the magnitude chosen for each of the four delayed input signals may be smaller. Further, if a narrower current signal is chosen, a smaller PFD turn on time is required. The PFD turn on time can also be minimized by increasing the number of delay elements.

The proposed approach can solve the designers problem in the digital domain, by using digital PFDs to relax the analog design of the charge-pump. For example, the 4 mA charge pump covers a large area and has a slow response, under same power, compared to four PFDs, each with a 1 mA charge pump. Moreover, the 4 mA charge pump suffers from large parasitic capacitance and significantly increases the minimum PFD turn-on time to avoid the dead-zone problem.

Although the reduced PFD lock-in range, as seen in FIG. 8(b), may be a disadvantage, it does not affect the capability of frequency detection in the PLL of the present invention. Moreover, it improves the average slew-rate of the PLL, when the PLL is out-of-lock, and increases the turn-on time, when the PLL is locked. However, the use of a 1 mA charge pump reduces the minimum PFD turn-on time, so the total turn-on time may not even be increased, or may even decrease, in the PLL, depending on the manufacturer.

Embodiments of the present invention may be used in devices, such as frequency synthesizers, based on a digital PLL device. Embodiments may be usable in all types of wireless communication devices and communication systems. If the PLL is a high speed CMOS device, the $I_c$ current of the charge pump, may be as little as 1.2 mA, for three delay elements, instead of 4.5 mA.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A phase locked loop (PLL) circuit with time-delayed phase/frequency detector (PFD) input signals for generating PFD gain, the circuit comprising:

a first divider for receiving digital input signals with reference frequency and period T, and creating an output signal obtained by dividing the reference frequency by a value R;

a phase/frequency detector (PFD) having a plurality of input pairs, each input pair having a reference input, a feedback input and an output;

a plurality of input signal reference delay devices connected in a series between the first divider and the PFD for providing a plurality of time-delayed PFD reference input signals in each period T, each said input signal provided with a different time delay;

a charge pump connected to the output of the PFD, the charge pump having an output;

a loop filter connected to the output of the charge pump, the loop filter having an output;

a voltage-controlled oscillator (VCO) connected to the output of the loop filter for providing an output signal with VCO frequency, the VCO having an output;

a second divider, connected to the output of the VCO, for dividing the VCO frequency by a value M; and a plurality of feedback signal delay devices connected in a series for providing a plurality of time-delayed PFD feedback input signals in each period T, each said input signal with a different time delay; wherein the delayed reference signal and the delayed feedback signal at each said PFD input pair having the same time delay.

2. The PLL circuit of claim 1 wherein R, M and N being integers, and N representing the number of time delayed PFD signal pairs in each period T, for increasing the PFD phase detection gain N times by multiplying the frequency of the charge pump input signal.

3. The PLL circuit of claim 1 wherein each said reference delay means and the feedback signal delay means having the same time delay period.

4. The PLL circuit of claim 3 wherein the time delay period being between four and sixteen times smaller than the period T.

5. The PLL circuit of claim 3 wherein the width of each said delayed reference and feedback signal is no more than 1/N times the period T.

6. The PLL circuit of claim 5 wherein the width of each said delayed reference and feedback signal is less than the width of the reference frequency input signals having the period T.

7. The PLL circuit of claim 1 wherein a first delay means of said input signal reference delay means connected to the first divider output and the reference input of a first PFD input pair, and the other delay means of said input signal reference delay means connected to a previous delay means in the series, and the reference input of the corresponding PFD input pair.

8. The PLL circuit of claim 1 wherein a first delay means of said feedback signal delay means connected to the second divider output and the feedback input of the corresponding PFD input pair, and the last delay means of said feedback signal delay means connected to a previous delay means in the series, and the feedback input of the corresponding PFD input pair.

9. A phase locked loop (PLL) circuit with time-delayed phase/frequency detector (PFD) input signals for generating PFD gain, the circuit comprising:

a first divider for receiving digital input signals with reference frequency and period T, for dividing the reference frequency by a value R, and creating a plurality of time-delayed reference output signals in each period T, each said output signal with a different time delay;

a plurality of phase/frequency detectors, each having a first and a second output, a reference input, and a feedback input, and receiving on the reference input one of the plurality of time-delayed reference output signals from the first divider;

a first OR means for receiving the first output signals from the plurality of said PDFs;

a second OR means for receiving the second output signals from the plurality of said PDFs;

a charge pump having two inputs for receiving signals output from the first and second OR means;

a loop filter connected to an output of the charge pump;

a voltage-controlled oscillator (VCO) connected to an output of the loop filter for providing an output signal with VCO frequency; and a second divider, connected to an output of the VCO, for dividing the VCO frequency by a value M, and creating a plurality of time-delayed feedback output signals in each period T, each said output signal with a different time delay, wherein each said PFD receiving, on the feedback input, one of the plurality of time-delayed feedback output signals from the second divider, and the delayed reference signal and the delayed feedback signal at the inputs of each said PFD having the same time delay.

10. The PLL circuit of claim 9 wherein R, M and N being integers, and N representing the number of time delayed output signals in each period T, for increasing the PFD phase detection gain N times by multiplying the frequency of the charge pump input signal.

11. The PLL circuit of claim 9 wherein the first and the second divider having the same time delay period.

12. The PLL circuit of claim 11 wherein the time delay period being between four and sixteen times smaller than the period T.

13. The PLL circuit of claim 11 wherein the width of each said delayed reference and feedback signal is no more than 1/N times the period T.

14. The PLL circuit of claim 13 wherein the width of each said delayed reference and feedback signal is less than the width of the reference frequency input signals having the period T.

15. The PLL circuit of claim 10 wherein the first divider and the second divider each having a control logic circuit for adjusting the number of delay means N−1 for obtaining the PFD gain accordingly.

16. A method for enhancing the gain of a phase locked loop (PLL) circuit having a first divider, a phase/frequency detector (PFD) having a plurality of input pairs, each said input pair having a reference input and a feedback input, a charge pump, a loop filter, a voltage-controlled oscillator (VCO), and a second divider, the method comprising the steps of:

receiving digital input signals with reference frequency and period T in the first divider, and creating an output signal by dividing the reference frequency by a value R;

providing a plurality of time-delayed PFD reference input signals in each period T, by a plurality of input signal reference delay means connected in a series between the first divider and the PFD, each said input signal with a different time delay;

dividing the VCO frequency by a value M in the second divider; and providing a plurality of time-delayed PFD feedback input signals in each period T, by a plurality of feedback signal delay devices connected in a series, each said input signal with a different time delay, wherein the delayed reference signal and the delayed feedback signal at each said PFD input pair have substantially the same time delay.

17. The method of claim 16 wherein R, M and N being integers, and N representing the number of time delayed PFD signal pairs in each period T, for increasing the PFD phase detection gain N times by multiplying the frequency of the charge pump input signal.

18. The method of claim 16 wherein each reference delay means and the feedback signal delay means having the same time delay period.

19. The method of claim 18 wherein the time delay period being between four and sixteen times smaller than the period T.

20. The method of claim 18 wherein the width of each said delayed reference and feedback signal is no more than 1/N times the period T.

21. The method of claim 20 wherein the width of each said delayed reference and feedback signal is less than the width of the reference frequency input signals having the period T.

22. A method for enhancing the gain of a phase locked loop (PLL) circuit having a first divider, a plurality of phase/frequency detectors (PFDs), each having a first and a second output, a reference input, and a feedback input, a charge pump having a first and a second input, two OR means, a loop filter, a voltage-controlled oscillator (VCO), and a second divider, the method comprising the steps of:

receiving digital input signals with reference frequency and period T in the first divider, dividing the reference frequency by a value R, and creating a plurality of time-delayed reference output signals in each period T, each said output signal with a different time delay;

receiving on each said PFD reference input one of the plurality of time-delayed reference output signals from the first divider;

or-ing the first output signals from the plurality of said PDFs and supplying a first charge pump input;

or-ing the second output signals from the plurality of said PDFs and supplying a second charge pump input;

dividing the VCO frequency by a value M in the second divider;

creating a plurality of time-delayed feedback output signals in each period T in the second divider, each said output signal with a different time delay; and supplying each said PFD feedback input with one of the plurality of time-delayed feedback output signals, wherein the time-delayed reference output signal and the time-delayed feedback output signal at the inputs of each said PFD having the same time delay.

23. The method of claim 22 wherein R, M and N being integers, and N representing the number of time delayed PFD signals in each period T, for increasing the PFD phase detection gain N times by multiplying the frequency of the charge pump input signal.

24. The method of claim 22 wherein the first and the second divider having the same time delay period.

25. The method of claim 24 wherein the time delay period being between four and sixteen times smaller than the period T.

26. The method of claim 24 wherein the width of each said delayed reference and feedback signal is no more than 1/N times the period T.

27. The method of claim 26 wherein the width of each said delayed reference and feedback signal is less than the width of the reference frequency input signals having the period T.

28. The method of claim 26 further comprises the step of adjusting the number of delay means N−1, in the first divider and the second divider control logic circuit, for obtaining the PFD gain accordingly.

29. A method for enhancing the gain of a phase locked loop (PLL) circuit with a phase/frequency detector (PFD) having a plurality of input pairs, the method comprising the steps of:

receiving digital input signals with reference frequency and period T;

creating a plurality of time-delayed reference output signals from the digital input signals in each period T;

receiving on each PFD reference input one of the plurality of time-delayed reference output signals;

creating a plurality of time-delayed feedback output signals from the loop output signals in each period T; and supplying each PFD feedback input with one of the plurality of time-delayed feedback output signals, wherein the time-delayed reference output signal and the time-delayed feedback output signal at each said PFD input pair having the same time delay.

30. A method for enhancing the gain of a phase locked loop (PLL) circuit having a plurality of phase/frequency detectors (PFDs), comprising the steps of:

receiving digital input signals with reference frequency and period T;

creating a plurality of time-delayed reference output signals from the digital input signals in each period T;

receiving on each PFD reference input one of the plurality of time-delayed reference output signals;

or-ing output signals from the plurality of said PDFs and supplying a charge pump, loop filter and voltage-controlled oscillator (VCO) connected in a series;

creating a plurality of time-delayed feedback output signals in each period T from the VCO output signal; and supplying each PFD feedback input with one of the plurality of time-delayed feedback output signals, wherein the time-delayed reference output signal and the time-delayed feedback output signal at the inputs of each said PFD having the same time delay.

* * * * *